United States Patent [19]
Gersbach et al.

[11] Patent Number: 5,504,459
[45] Date of Patent: Apr. 2, 1996

[54] FILTER NETWORK FOR PHASE-LOCKED LOOP CIRCUIT

[75] Inventors: John E. Gersbach, Burlington, Vt.; Todd Williams, Sunnyvale, Calif.

[73] Assignee: International Business Machines Corporation, Armonk, N.Y.

[21] Appl. No.: 407,346

[22] Filed: Mar. 20, 1995

[51] Int. Cl.$^6$ ............................................. H03L 7/093
[52] U.S. Cl. ........................ 331/17; 331/34; 331/177 R; 327/156
[58] Field of Search ............................ 331/1 A, 17, 18, 331/25, 34, 57, 177 R, 185, 186; 327/156–159

[56] References Cited

U.S. PATENT DOCUMENTS

| | | | |
|---|---|---|---|
| 3,445,756 | 5/1969 | Rooney, Jr. | 323/119 |
| 3,667,031 | 5/1972 | Cox, Jr. et al. | 323/101 |
| 3,893,039 | 7/1975 | Yang et al. | 331/12 |
| 3,993,958 | 11/1976 | Cutsogeorge | 328/109 |
| 4,336,505 | 6/1982 | Meyer | 331/1 R |
| 4,829,258 | 5/1989 | Volk et al. | 328/155 |
| 4,855,689 | 8/1989 | Kinkel | 331/17 |
| 4,987,387 | 1/1991 | Kennedy et al. | 331/1 A |
| 5,057,705 | 10/1991 | Uchikoshi | 307/269 |
| 5,072,196 | 12/1991 | Rousselet et al. | 331/12 |
| 5,075,643 | 12/1991 | Einbinder | 332/135 |
| 5,097,228 | 3/1992 | McJunkin | 331/185 X |
| 5,103,352 | 4/1992 | Moon et al. | 360/65 |
| 5,175,884 | 12/1992 | Suarez | 331/177 R X |
| 5,254,955 | 10/1993 | Saeki et al. | 331/17 X |
| 5,272,452 | 12/1993 | Adachi et al. | 331/17 |
| 5,302,919 | 4/1994 | Abe | 331/2 |
| 5,334,953 | 8/1994 | Mijuskovic | 331/8 |
| 5,359,298 | 10/1994 | Abe | 331/2 |
| 5,369,376 | 11/1994 | Leblebicioglu | 331/8 |
| 5,382,922 | 1/1995 | Gersbach et al. | 331/1 A |
| 5,399,994 | 3/1995 | Siniscalchi et al. | 331/17 |

*Primary Examiner*—David Mis
*Attorney, Agent, or Firm*—heslin & Rothenberg

[57] ABSTRACT

A filter network is presented for a phase-locked loop (PLL) circuit having a voltage controlled oscillator (VCO) with a control input and a bias input. The filter network includes a conventional filter circuit that provides a "pole" and a "zero" to the transfer function of the PLL circuit. The conventional filter circuit is coupled between the control input of the VCO and ground. An additional filter circuit is also coupled to the control input of the VCO, and to a bias input of the VCO. This additional filter circuit provides at least one additional "zero" to the PLL transfer function to extend the frequency range of the PLL circuit without impairing circuit stability. A transconductance amplifier is preferably employed within the additional filter circuit to facilitate tailoring of the open loop gain of the filter/oscillator circuitry.

14 Claims, 4 Drawing Sheets

FILTER NETWORK FOR PHASE-LOCKED LOOP CIRCUIT

TECHNICAL FIELD

The present invention relates in general to phase-locked loops (PLLs), and more particularly, to a filter network for enhancing the transfer function of a PLL circuit by optimizing the open loop gain of the filter/oscillator components to thereby extend the frequency response of the PLL circuit without impairing circuit stability.

BACKGROUND ART

As is well known, a phase-locked loop circuit produces an output signal which tracks an input signal in frequency and exhibits a fixed phase relationship to the input signal. As the input signal changes in frequency, the output signal likewise changes in such a manner as to maintain the phase relationship between the input and output signals. Originally, phase-locked loops were implemented using only analog techniques. These techniques continue in use today in many data processing and communication systems. An analog phase-locked loop circuit typically consists of four fundamental parts; namely, a phase detector, a charge pump, a filter and a voltage controlled oscillator (VCO).

The phase detector is a device which detects the difference in phase between two input signals, and produces an output signal proportional to the amount of the phase difference. In a phase-locked loop circuit the two inputs to the phase detector are the input to the phase-locked loop and the output signal of the VCO, i.e., the output of the phase-locked loop circuit. The output signal from the phase detector is an analog up/down signal, the magnitude of which is representative of the amount of phase difference between the two input signals thereto, hereinafter referred to as an error signal. The charge pump produces a control voltage based on this error signal and outputs the control voltage to the filter, which is disposed at the control input to the VCO. The filter serves to remove any high frequency components from the error signal produced by the charge pump and provides a slowly varying output signal which is representative of the average error in phase between the output signal and the input signal.

The voltage controlled oscillator is an analog oscillator which generates an output signal having a frequency corresponding to the slowly varying control signal across the filter. In one conventional embodiment, the voltage controlled oscillator comprises a voltage-to-current converter which is coupled through a summing node to an oscillator that provides the output signal from an input current. Often, a fixed biased current is also fed to the summing node from an appropriate bias circuit. This bias current, received at a bias input of the VCO, operates to moderate the gain characteristics of the VCO.

Due to the feedback of the VCO output signal to an input of the phase detector, the frequency of the voltage controlled oscillator is adjusted by the VCO input signal, i.e., the control signal across the filter, to maintain the fixed relationship between the input signal and the output signal of the PLL circuit. The filter/VCO components of the PLL circuit define the PLL transfer function. Specifically, the transfer function includes a "pole" and a "zero" provided by the filter. In the complex frequency domain, a pole is defined as a value of infinity, while a zero comprises a null. Often, because of noise it is desirable to extend the useful gain of the PLL's transfer function to higher frequencies, i.e., without introducing instability to the PLL by extending the useable frequency range too far. Unfortunately, existing PLL circuit designs provide limited flexibility in this regard. Thus, the present invention is directed to addressing this deficiency.

DISCLOSURE OF INVENTION

Briefly summarized, the present invention comprises in one aspect a filter network for a phase-locked loop (PLL) circuit having a voltage controlled oscillator (VCO) with a control input and a bias input. The filter network includes a first filter circuit and a second filter circuit. The first filter circuit is coupled to the control input of the VCO and provides both a "pole" and a "zero" to the transfer function of the PLL. The second filter circuit is coupled between the control input and the bias input to the VCO. This second filter circuit provides at least one additional "zero" to the transfer function of the PLL in order to extend the usable frequency of the PLL without introducing instability to the PLL.

In another aspect, the invention comprises a phase-locked loop (PLL) circuit having a transfer function. The PLL circuit includes a phase detector for comparing the phases of an output signal of the PLL circuit and a reference signal to produce therefrom an error signal representative of any phase difference therebetween. An amplifier circuit is coupled to the phase detector to receive the error signal and produce therefrom a voltage control signal $V_c$ at an output thereof. A first filter circuit is connected between the output of the amplifier circuit and ground. This first filter circuit provides both a "zero" and a "pole" to the transfer function of the PLL circuit. A voltage controlled oscillator (VCO), having a control input and a bias input, is coupled to receive the voltage control signal $V_c$ at the control input thereof. An output of the VCO provides the output signal of the PLL circuit which, as noted, is fed back to one input of the phase detector. A second filter circuit, coupled to the control input and to the bias input of the VCO, is also provided. This second filter circuit provides at least one additional "zero" to the transfer function of the PLL circuit so as to optimize the open loop gain and extend the frequency response of the PLL circuit without impairing circuit stability.

To restate, provided herein is a novel filter network for an analog phase-locked loop circuit which can be employed to introduce additional gain into the response curve of the PLL, to thereby extend the useful gain to higher frequencies. This is accomplished without introducing instability to the PLL circuit. The additional gain is introduced into the filter/VCO circuitry by connecting a supplementary filter circuit between the filter node input and the bias node input of the VCO, and arranging this additional filter circuit to have a desired level of input impedance and gain to extend the frequency response curve as desired. By extending the frequency response curve, the loop response time is improved by an equally significant factor. Since the bias node typically employs a bias circuit with gain, no additional components are required to implement the concepts presented herein.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Figure 1:
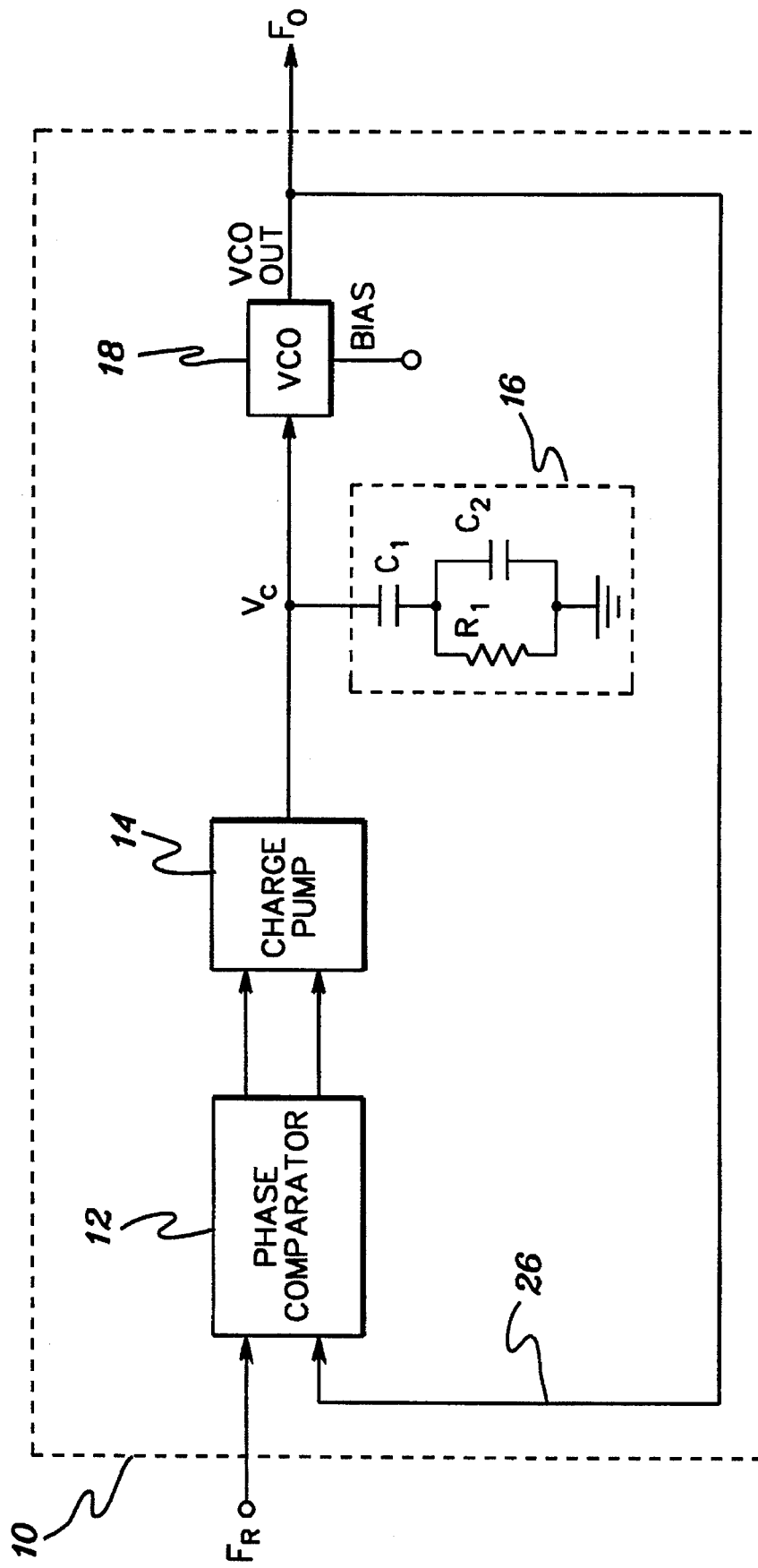
FIG. 1 is a schematic of one embodiment of a conventional phase-locked loop circuit.

Reference is now made to the drawings wherein the same reference characters used throughout multiple figures designate the same or similar components. FIG. 1 depicts one embodiment of a conventional phase-locked loop (PLL) circuit 10. PLL circuit 10 includes a phase comparator 12 which is coupled through a charge pump 14 and a filter 16 to a voltage controlled oscillator (VCO) 18. The output $F_O$ of VCO 18 comprises the frequency output from PLL circuit 10. The voltage across filter 16, referred to herein as the voltage control signal $V_c$, comprises an input signal to voltage controlled oscillator 18.

A feedback line 26 provides output signal $F_O$ to one of two inputs of phase comparator 12 so that PLL circuit 10 comprises a closed loop circuit. The other comparator input receives a reference frequency signal $F_R$. If desired, a feedback divider (not shown) could be interposed along line 26 from the output of VCO 18 to the one input of phase comparator 12. Without such a divider, the oscillator's output frequency $F_O$ will mirror the received reference frequency $F_R$. A bias circuit (not shown) feeds a desired dc signal to a bias node "BIAS" of VCO 18. As an example, the bias circuit may comprise a power supply voltage coupled across a resistor to the bias node. The current signal at this bias node provides a nominal operating point for VCO 18, i.e., a base frequency output when control voltage signal $V_c$ is zero.

Figure 2:
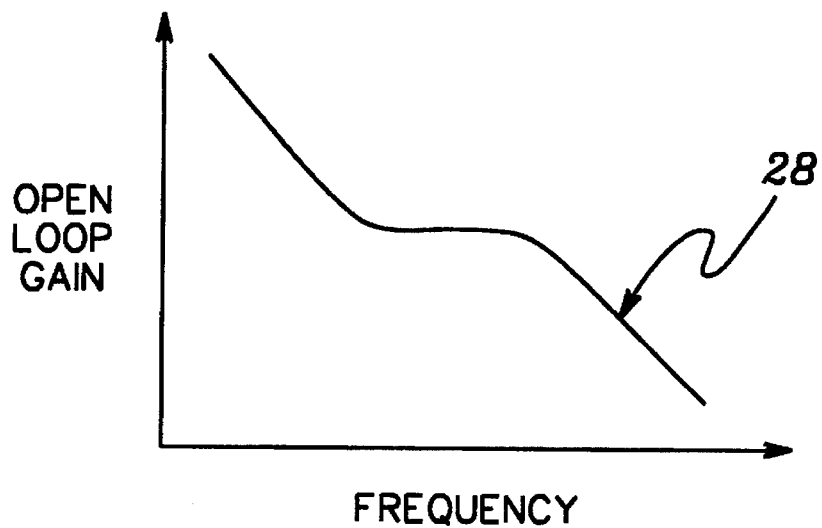
FIG. 2 is a graph of a sample transfer function for the PLL circuit of FIG. 1.

A sample transfer function 28 of filter 16 and VCO 18 of PLL circuit 10 is depicted in FIG. 2. The "pole" provided by filter 16 results in decreasing open loop gain as frequency increases. The flat region of function 28 is produced by a summation of the "pole" and the "zero" provided by filter 16. The result of this summation is an increase in the useful gain at higher frequencies. Beyond the flat region, however, the influence of the "zero" is no longer significant, and the "pole" dictates a decreasing gain with frequency at a rate comparable to that prior to reaching the "zero". Again, for certain applications, the gain of this transfer function may fall too quickly beyond the flat region with increasing frequency.

The solution presented herein is to create one or more additional "zeros" to further tailor the frequency response of the gain of the VCO. One embodiment of a PLL circuit 10' implementing this concept is set forth in FIG. 3. PLL circuit 10' is similar to PLL circuit 10 of FIG. 1 except that a supplemental filter circuit 30 is introduced between the filter node input and the bias node input to VCO 18. PLL circuit 10' includes phase comparator 12, charge pump 14, conventional filter 16 and VCO 18. The output $F_O$ of VCO 18 is fed back to one input of phase comparator 12, the other input of which receives a reference frequency signal $F_R$. As in the initial embodiment, filter 16 serves to stabilize the phase-locked loop circuit and provides both a "pole" and a "zero" to the transfer function of the PLL.

In this embodiment, VCO 18 is shown to comprise a voltage-to-current converter 20, a summing node 22 and an oscillator 24. Operationally, the voltage control signal $V_c$ input to VCO 18 is transformed to a current signal by voltage-to-current converter 20. This current signal is summed with a bias current received at the bias node input to VCO 18 and together the resulting signal feeds oscillator 24. Depending upon the implementation of filter circuit 30 (described further below), a conventional current bias circuit 32 may also be connected to the bias node. As one example, current bias circuit 32 could simply comprise a power supply voltage coupled across a resistance to the bias node.

Figure 4:
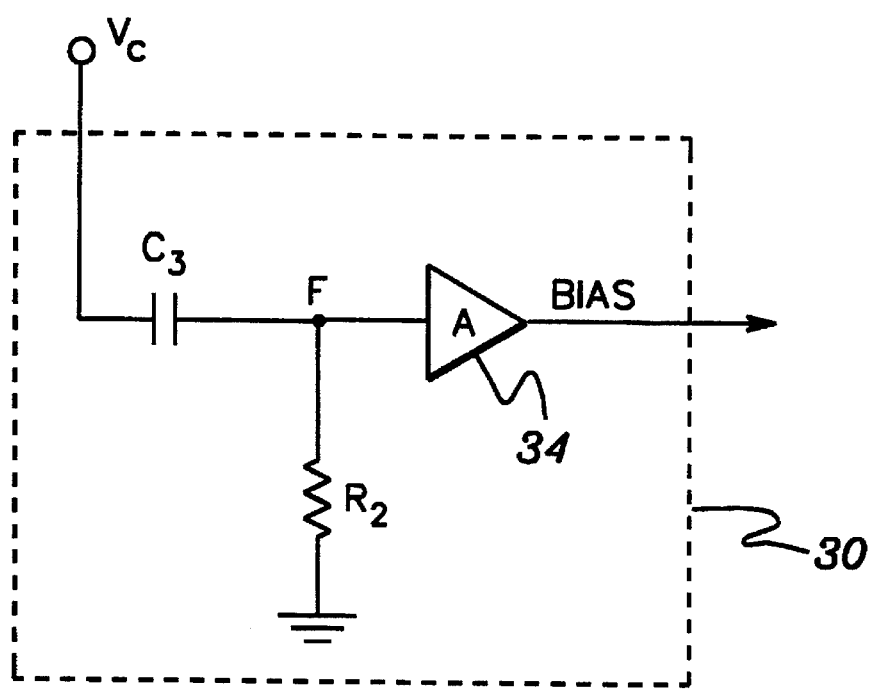
FIG. 4 is a schematic of one embodiment of a supplemental filter circuit in accordance with the present invention for the PLL circuit of FIG. 3.

By appropriately configuring filter circuit 30, one or more "zeros" can be added to the PLL transfer function through the bias node of the VCO. Filter circuit 30 operates to set the input impedance and gain of the VCO so as to extend the frequency response curve higher and improve loop response time. One embodiment of circuit 30 is depicted in FIG. 4. A capacitor $C_3$ is coupled between the control node input, receiving control voltage $V_c$, and an input to an amplifier 34, which has an output connected to the "BIAS" node of the voltage controlled oscillator. A resistor $R_2$ connects junction 'F', between capacitor $C_3$ and the input to amplifier 34, to ground. The $R_2C_3$ time constant provides the new "zero", while amplifier 34, for example, comprising a transconductance amplifier, is a booster amplifier whose gain may be tailored by design to give a desired response. The amplifier can provide a bias signal with both ac and dc components, with the ac component comprising the RC time constant of filter circuit 30 and the dc component comprising a bias current that may determine the center frequency of the VCO. In such a case, the conventional bias circuit 32 (FIG. 3) coupled to the bias node input may be unnecessary.

Figure 3:
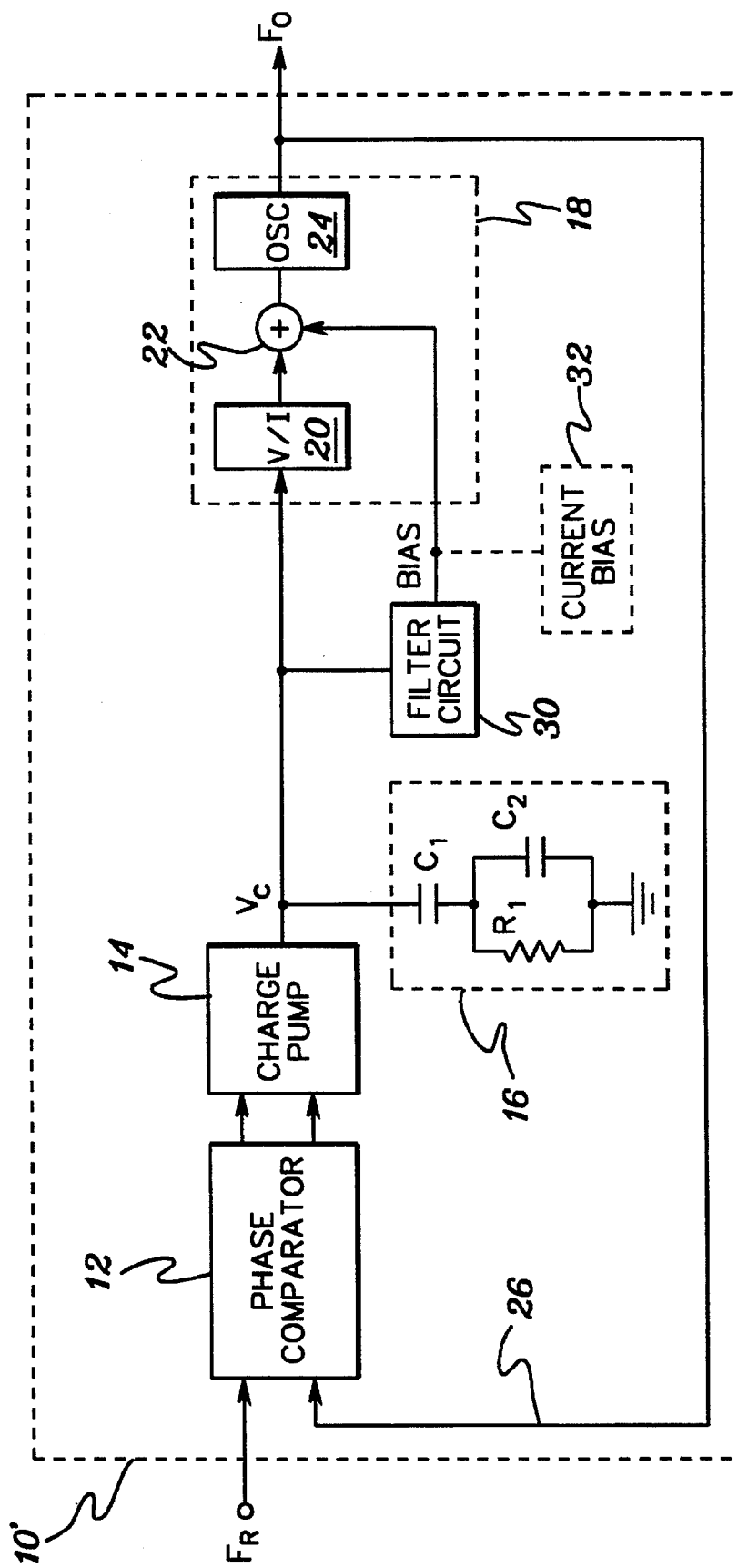
FIG. 3 is a schematic of one embodiment of a phase-locked loop circuit in accordance with the present invention.
Figure 5:
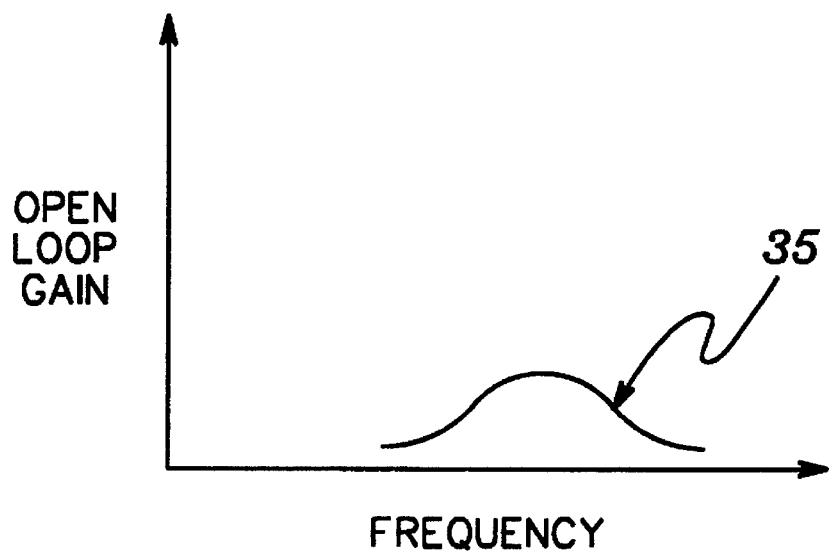
FIG. 5 is a graph of a sample transfer function depicting the "zero" provided by the supplemental filter circuit of FIG. 4.
Figure 6:
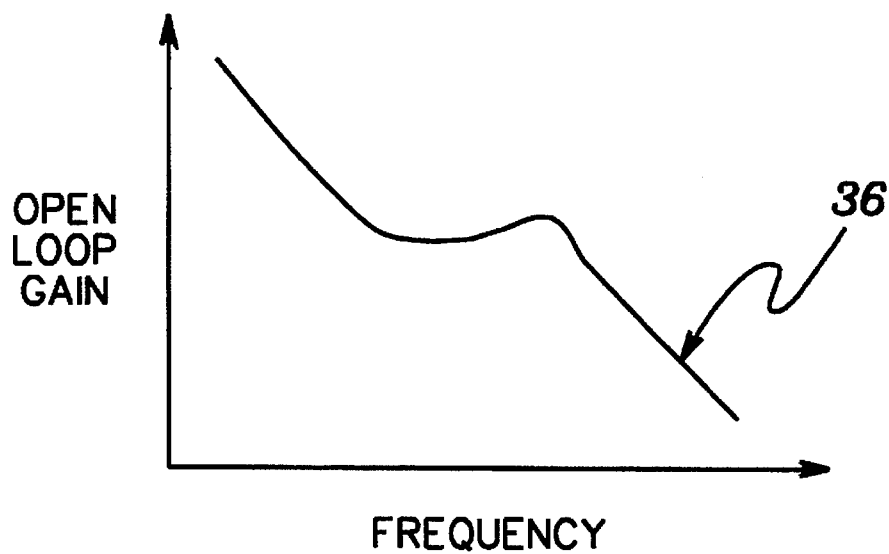
FIG. 6 is a graph of a sample transfer function for the PLL circuit of FIG. 3.

By way of example, a sample plot 35 of gain versus frequency for one "zero" provided by the supplement filter circuit is depicted in FIG. 5 and a resultant, sample transfer function for PLL circuit 10' of FIG. 3 is shown in FIG. 6. In this embodiment, the RC time constant for filter circuit 30 is chosen to be just above the "zero" frequency provided by primary filter 16 of PLL circuit 10'. The gain can thus be optimized to extend the frequency response without adversely effecting PLL stability. The voltages on the control node and the bias node to the VCO are summed in terms of their effect on the VCO transfer curve so that frequencies above approximately $\frac{1}{2}\pi R_2 C_3$ are boosted.

To restate, provided herein is a novel filter network for an analog phase-locked loop circuit which can be employed to introduce at least one additional zero into the response curve of the PLL circuit, thereby extending the useful gain to higher frequencies. This is accomplished without introducing instability to the PLL circuit. The additional gain is introduced into the filter/VCO circuitry by connecting a supplementary filter circuit between the filter node input and the bias node input of the VCO, and arranging this filter circuit to have a desired level of input impedance and gain to extend the frequency response curve as desired. By extending the frequency response curve, the loop response time is improved by an equally significant factor. Since the bias node typically employs a bias circuit with gain, no additional components are required to implement the concepts presented herein.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A filter network for a phase-locked loop (PLL) circuit having a voltage controlled oscillator (VCO) with a control input and a bias input, said filter network comprising:
   a first filter circuit coupled to the control input of the VCO, said first filter circuit providing a "pole" and a "zero" to a transfer function of the PLL circuit; and
   a second filter circuit coupled to the control input and to the bias input of the VCO, said second filter circuit providing at least one additional "zero" to the transfer function of the PLL circuit to thereby extend a usable frequency range of the PLL circuit.

2. The filter network of claim 1, wherein said first filter circuit comprises a first resistance capacitance (RC) circuit connected between the control input of the VCO and ground.

3. The filter network of claim 2, wherein said second filter circuit comprises a second resistance capacitance (RC) circuit coupled to the control input and to the bias input of said VCO.

4. The filter network of claim 3, wherein said second filter circuit also comprises an amplifier coupled between said second RC circuit and said bias input to the VCO.

5. The filter network of claim 4, wherein said amplifier comprises a transconductance amplifier having a voltage input and a current output, and wherein said second RC circuit comprises a capacitance and a resistance, said capacitance being coupled between said control input of said VCO and said voltage input of said transconductance amplifier, and said resistance being coupled between said voltage input of said transconductance amplifier and ground.

6. The filter network of claim 4, wherein said amplifier provides both ac and dc current components to said bias input of said VCO, said dc current component determining a center frequency output of said VCO, and said ac current component providing said at least one additional "zero" to the transfer function of the PLL circuit.

7. The filter network of claim 1, further comprising a current bias circuit connected to the bias input of said VCO, said current bias circuit providing bias current to said bias input, said bias current affecting a center frequency output of said VCO.

8. A phase-locked loop (PLL) circuit having a transfer function, said PLL circuit comprising:
   a phase detector for comparing phases of an output signal of the PLL circuit and a reference signal to produce therefrom an error signal representative of any phase difference therebetween;
   an amplifier circuit coupled to receive the error signal and produce therefrom a voltage control signal $V_c$ at an output thereof;
   a first filter circuit coupled between the output of said amplifier circuit and ground, said first filter circuit providing a "zero" and a "pole" to the transfer function of the PLL circuit;
   a voltage controlled oscillator (VCO) having a control input and a bias input, said control input being coupled across said first filter circuit to said output of said amplifier circuit to receive said voltage control signal $V_c$, an output of said VCO providing said output signal of the PLL circuit; and
   a second filter circuit coupled to said control input and to said bias input of said VCO, said second filter circuit providing at least one additional "zero" to the transfer function of the PLL circuit.

9. The PLL circuit of claim 8, wherein said voltage controlled oscillator comprises:
   a voltage-to-current converter coupled to the amplifier circuit to receive via the control input of the VCO the voltage control signal $V_c$ and generate therefrom a converter current $I_c$;
   a current controlled oscillator having a current input $I_O$ and a frequency output $F_O$, the frequency output $F_O$ of the current controlled oscillator comprising the output signal of the PLL circuit and being proportional to the current input $I_O$; and
   a summing node for summing the converter current $I_c$ and a bias current $I_b$ received at the bias input, wherein the current input $I_O$ comprises the summation of the converter current $I_c$ and the bias current $I_b$.

10. The PLL circuit of claim 9, wherein said second filter circuit includes an amplifier that provides a current output having both ac and dc current components, said current output being provided to said bias input of said VCO, said dc current component determining a center frequency output of said VCO, and said ac current component providing said at least one additional "zero" to the transfer function of the PLL circuit.

11. The PLL circuit of claim 10, wherein said second filter circuit further comprises a resistance capacitance (RC) circuit comprising a capacitance and a resistance, said capacitance being coupled between said control input of said VCO and an input of said amplifier, said resistance being coupled between said input of said amplifier and ground.

12. The PLL circuit of claim 8, wherein said first filter circuit comprises a first resistance capacitance (RC) circuit connected between the control input of a VCO and ground, and wherein said second filter circuit comprises a second resistance capacitance (RC) circuit, said second RC circuit being coupled to the control input and to the bias input of said VCO.

13. The PLL circuit of claim 12, wherein said second RC circuit comprises a capacitance coupled between the control input and the bias input of said VCO and a resistance coupled between the bias input of said VCO and ground.

14. The PLL circuit of claim 8, further comprising a current bias circuit connected to the bias input of said VCO, said current bias circuit providing a bias current to said bias input, said bias current affecting a center frequency output of said VCO.

* * * * *